United States Patent [19]
Wang et al.

[11] Patent Number: 5,920,796
[45] Date of Patent: Jul. 6, 1999

[54] IN-SITU ETCH OF BARC LAYER DURING FORMATION OF LOCAL INTERCONNECTS

[75] Inventors: Fei Wang; Allison Holbrook, both of San Jose; James K. Kai, San Francisco, all of Calif.

[73] Assignee: Advanced Micro Devices, Inc., Sunnyvale, Calif.

[21] Appl. No.: 08/924,572

[22] Filed: Sep. 5, 1997

[51] Int. Cl.$^6$ .................................................. H01L 21/306
[52] U.S. Cl. ........................... 438/700; 438/700; 438/706; 438/711; 438/712; 438/713; 438/723; 438/724; 438/725; 438/636
[58] Field of Search ..................................... 438/700, 636, 438/638, 640, 672, 673, 675, 701–703, 706, 711–714, 717, 723–725, 734–740, 743–744

[56] References Cited

U.S. PATENT DOCUMENTS

| | | |
|---|---|---|
| 4,920,065 | 4/1990 | Chin et al. ............................... 438/243 |
| 5,387,535 | 2/1995 | Wilmsmeyer . |
| 5,391,520 | 2/1995 | Chen et al. . |
| 5,453,400 | 9/1995 | Abernathey et al. . |
| 5,489,797 | 2/1996 | Chan et al. . |
| 5,516,726 | 5/1996 | Kim et al. . |
| 5,521,106 | 5/1996 | Okabe . |
| 5,563,096 | 10/1996 | Nasr . |
| 5,580,700 | 12/1996 | Rahman . |
| 5,589,415 | 12/1996 | Blanchard . |
| 5,600,165 | 2/1997 | Tsukamoto et al. . |
| 5,621,232 | 4/1997 | Ohno . |
| 5,621,235 | 4/1997 | Jeng . |
| 5,780,338 | 7/1998 | Jeng et al. ............................... 438/253 |
| 5,792,684 | 8/1998 | Lee et al. ................................. 438/238 |

*Primary Examiner*—Tuan H. Nguyen
*Assistant Examiner*—Thanh Nguyen

[57] ABSTRACT

An in-situ etching process for creating local interconnects in a semiconductor device includes using one etching tool to: etch through an organic, or inorganic BARC layer using $O_2$ gas, or $C_2F_6/O_2$ gases, respectively; a masked dielectric layer to a stop layer using a mixture of $C_4F_8$, $CH_3F$ and argon (Ar) gasses; etch away the mask layer using a mixture of $O_2$ and Ar gasses; and, etch through the stop layer using a mixture of $CH_3F$ gas and $O_2$ gas. Remaining portions of the BARC layer, whether organic or inorganic, are also removed during the in-situ etching process using appropriate gases. The method then includes depositing conductive material within the openings that were etched to form local interconnects.

25 Claims, 4 Drawing Sheets

IN-SITU ETCH OF BARC LAYER DURING FORMATION OF LOCAL INTERCONNECTS

TECHNICAL FIELD

The present invention relates to semiconductor devices and manufacturing processes, and more particularly to methods for providing local interconnections between two or more regions within a semiconductor device.

BACKGROUND ART

A continuing trend in semiconductor technology is to build integrated circuits with more and/or faster semiconductor devices. The drive toward this ultra large-scale integration (ULSI) has resulted in continued shrinking of device and circuit features. To take advantage of increasing number of devices and to form them into one or more circuits, the various devices need to be interconnected.

To accomplish interconnection on such a small scale, a local interconnect is typically used within an integrated circuit to provide an electrical connection between two or more conducting or semi-conducting regions (e.g., active regions of one or more devices). For example, a plurality of transistors can be connected to form an inverting logical circuit using a local interconnect.

The local interconnect is typically a low-resistance material, such as a conductor or doped semiconductor, that is formed to electrically couple the selected regions. For example, in certain arrangements, damascene techniques are used to provide local interconnects made of tungsten (W), or a like conductor, which is deposited within an etched opening, such as via or trench that connects the selected regions together. The use of lower-level local interconnects reduces the coupling burden on the subsequently formed higher layers to provide such connectivity, which reduces the overall circuit size and as such tends to increase the circuit's performance. Accordingly, there is a continuing need for more efficient and effective processes for forming local interconnects.

SUMMARY OF THE INVENTION

The present invention provides an in-situ etching process for creating local interconnects that provides better process control, reduces processing failures, speeds production, and reduces manufacturing costs. The in-situ etching process includes forming openings in a semiconductor wafer having a plurality of layers, including either an organic, or inorganic, bottom anti-reflective layer (BARC) by using an etching tool to etch through selected portions of the BARC layer as defined by etch windows formed by a mask layer above the bottom anti-reflective layer. Next, the same etching tool is then used to etch through selected portions of a first underlying layer, below the BARC layer, using a mixture of $C_4F_8/CH_3F$ gasses. The selected portions of the first underlying layer to be etched are defined by the extended etch windows formed by the previously etched BARC layer. The same etching tool is then used to etch away the mask layer using $O_2$ gas, and then to etch through selected portions of a second underlying layer that is below the first underlying layer using a mixture of $CH_3F/O_2$ gasses. The selected portions of the second underlying layer are defined by etched openings in the first underlying layer corresponding to the extended etch windows.

In certain embodiments, the first underlying layer is a dielectric layer, such as, for example an oxide layer. The method in certain embodiments also includes supplying Argon (Ar) gas to the etching tool when etching either of the first underlying and mask layers.

In yet other embodiments, if the BARC layer is an organic material, then the method includes etching the selected portions of the bottom anti-reflective layer using $O_2$ gas. Alternatively, if the BARC layer is an inorganic material, then the method includes etching the selected portions of the bottom anti-reflective layer using $C_2F_6/O_2$ gases.

In still other embodiments, the method also includes depositing a conductive material within a local interconnect opening that was etched in-situ and extends through the first and second underlying layers. In certain embodiments, the conductive layer includes tungsten (W).

Thus, these and other embodiments of the present invention essentially provide an in-situ etching process that eliminates the need to relocate or otherwise move a semiconductor wafer between different process tools. As a result, the embodiments of the present invention provide better process control over the local interconnect etching and fabrication processes, while also reducing the likelihood of damaging the semiconductor wafer/devices, speeding up production, and reducing manufacturing costs.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF THE EXEMPLARY EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn so as to illustrate the important features of the present invention.

In accordance with an embodiment of the present invention, there is provided an in-situ etching process for use in fabricating local interconnects within an integrated circuit manufacturing process. The in-situ etching process eliminates the need to relocate or otherwise move a semiconductor wafer between different process tools. As such, the present invention tends to provide better process control over the local interconnect etching and fabrication processes, reduce the likelihood of damaging the semiconductor wafer/devices, speed production, and reduce manufacturing costs.

Figure 1A:
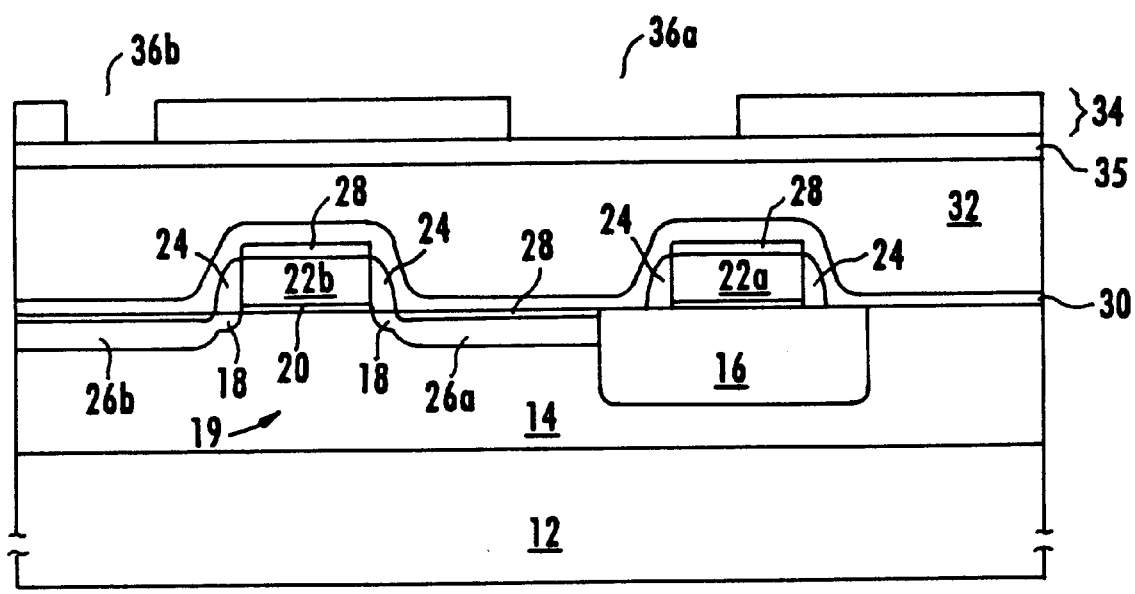
FIG. 1a depicts a cross-section of a portion of a semiconductor wafer which has been prepared for local interconnect etching, in accordance with an embodiment of the present invention.

FIG. 1a depicts a cross-section of a portion 10 of a semiconductor device being fabricated on a semiconductor wafer, in accordance with the present invention. Portion includes a substrate 12 and a device region 14. For example, in certain embodiments of the present invention substrate 12 is a heavily-doped silicon substrate approximately 2 mm thick and device region 12 is a lightly-doped epitaxial (epi) layer, approximately 4 $\mu$m thick, which is grown on the heavily-doped silicon substrate. An isolation region 16 is formed within device region 14 to separate active regions that will be used to fabricate the semiconductor devices. In certain embodiments of the present invention, each isolation region 16 is a shallow trench region that is lined with a thin oxide liner and subsequently filled with a thicker field oxide that is approximately 2,500 to 3,500Å thick. One or more conductors, such as, for example, gate conductor 22a, can be formed above isolation region 16.

Within an active region there is provided space to form an active device, such as field effect transistor, or other component. As depicted in FIG. 1, an exemplary field effect transistor 19 is created by forming a gate conductor 22b above the active region that includes a drain region 26a and a source region 26b. The formation of drain and source regions 26a and 26b is well known to those skilled in the art.

As depicted, gate conductors 22a and 22b were formed using the same or similar processes and as such share a common design. Thus, for example, in one embodiment of the present invention, a thin barrier oxide layer 20, approximately 55Å thick, is formed on top of isolation region 16 and device region 14. Next, gate conductors 22a and 22b are formed of on top of thin barrier oxide layer 20 using polycrystalline silicon that is approximately 1,700Å thick. Also within the active region, lightly doped regions 18, drain region 26a and source region 26b are formed through conventional ion-implantation processes, for example by using lithography masking techniques. Additionally, as is known in the art, spacers 24, such as oxide spacers, are provided along the sidewalls of gate conductor 22b to further control the doping of lightly doped regions 18. In certain embodiments, as is known in the art, a titanium-silicide layer 28, or other like layer, is formed on the exposed surfaces of gate conductors 22a and 22b, and region 26a and 26b.

Portion 10 further includes a conformal stop layer 30, such as, for example, a thin nitride layer approximately 800Å thick, formed on top of the wafer stack, including gate conductors 22a and 22b and other exposed regions. A dielectric layer 32, for example, a tetraethylorthosilicate (TEOS) oxide layer approximately 12000Å thick, is then applied over stop layer 30 using conventional processes, such as a plasma-enhanced chemical vapor deposition (PECVD) process. The exposed top surface of dielectric layer 32 is then planarized, for example, using an oxide chemical-mechanical polish (CMP), leaving dielectric layer 32 approximately 6500 to 9500Å thick and substantially planar on top (e.g., as depicted in FIG. 1).

A bottom anti-reflective coating (BARC) layer 35 is then applied on top of dielectric layer 32. The benefits of using BARC layers are known in the art. For example, a BARC layer can be used to suppress interference waves and avoid standing waves within the underlying layers during subsequent patterning process steps. Thus, when combined with the proper lithography techniques, BARC layer 35 will allow for a higher density layout. Furthermore, BARC layer 35 can also act as a barrier layer between dielectric layer 32 and a subsequently added resist mask 34. BARC layer 35, in certain embodiments of the present invention, is a thin layer of an organic material, such as, for example, a spin-on layer of CD-11. In other embodiments of the present invention, BARC layer 35 is a thin layer of an inorganic material, such as, for example, a deposited layer of silicone oxynitride (e.g., $SiO_xN_y$, referred to hereinafter simply as SiON).

Next, a resist mask, such as, for example, a deep-UV resist mask, is applied to BARC layer 35 to define one or more etch windows, such as etch windows 36a and 36b, for use in forming one or more local interconnects in the underlying wafer stack.

Figure 1B:
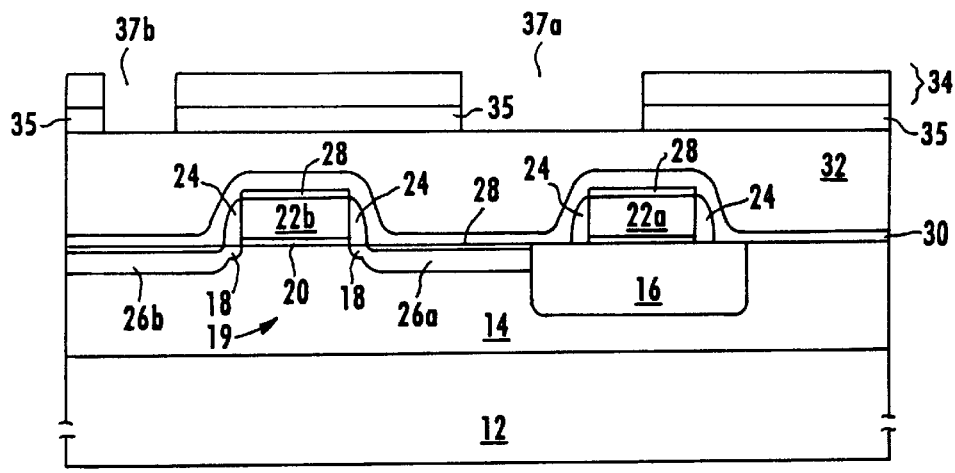
FIG. 1b depicts a cross-section of the portion of FIG. 1a following a BARC layer etching process, in accordance with an embodiment of the present invention.

FIG. 1b depicts portion 10 of FIG. 1a following a BARC layer etching process in which the pattern of resist mask 34 is essentially transferred to BARC layer 35 by anisotropically etching away exposed portions of BARC layer 35, for example, through etch windows 36a and 36b. As depicted, the BARC etching process creates extended etch windows 37a and 37b which leave selected portions of dielectric layer 32 exposed. Therefore, the BARC etching process preferably exhibits a high-selectivity to the dielectric material.

Figure 2:
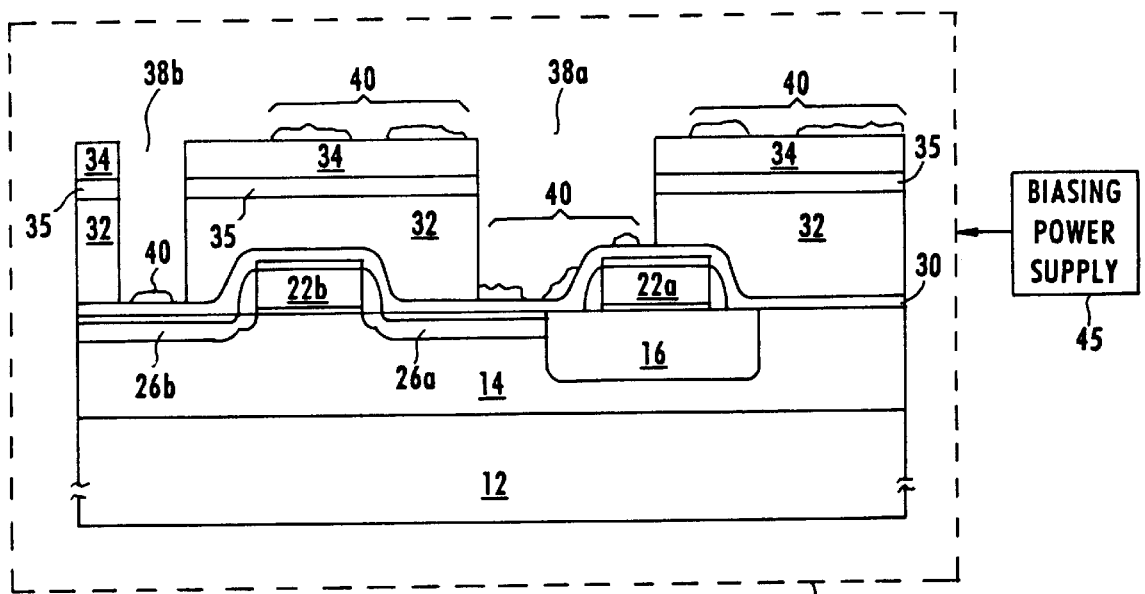
FIG. 2 depicts a cross-section of the portion of FIG. 1b following a first local interconnect etching process, in accordance with an embodiment of the present invention.

FIG. 2 depicts portion 10 of FIG. 1b following a dielectric etching process in an etching tool 43 in which etched openings 38a and 38b are created through extended etch windows 37a and 37b, respectively, and extend through dielectric layer 32 to stop layer 30. As depicted, the dielectric etching process, which is preferably an anisotropic etching process, removed the dielectric layer 32 material located substantially below etch windows 36a and 36b. By way of example, if dielectric layer 32 is an oxide layer and stop layer 30 is a nitride layer, such as, for example, silicon nitride ($Si_3N_4$), then an oxide etching process having a high-selectivity to nitride can be used to etch through the oxide layer 32 and stop on the nitride layer 30.

As further illustrated in FIG. 2, the dielectric etching process described above tends to produce polymer deposits 40 that can form on various surfaces of portion 10, including, for example, resist mask 34, BARC layer 35, stop layer 30 and dielectric layer 32. For example, an oxide etching process tends to produce silicon-rich polymer deposits within and without etched openings 38a and 38b. Regardless of their location, size, and/or shape, polymer deposits 40 typically need to be removed to allow for the proper formation of the local interconnects or future layers in subsequent process steps.

In previous semiconductor processes, polymer deposits 40 are removed during one or more subsequent resist stripping processes. Thus, for example, following the dielectric etching process the semiconductor wafer is removed from the etching tool 43 to a stripping tool (not shown) where resist mask 34 and polymer deposits 40 are then removed. BARC layer 35 would then be removed in either a wet or dry process. The resulting portion 10 is depicted in FIG. 3.

Figure 3:
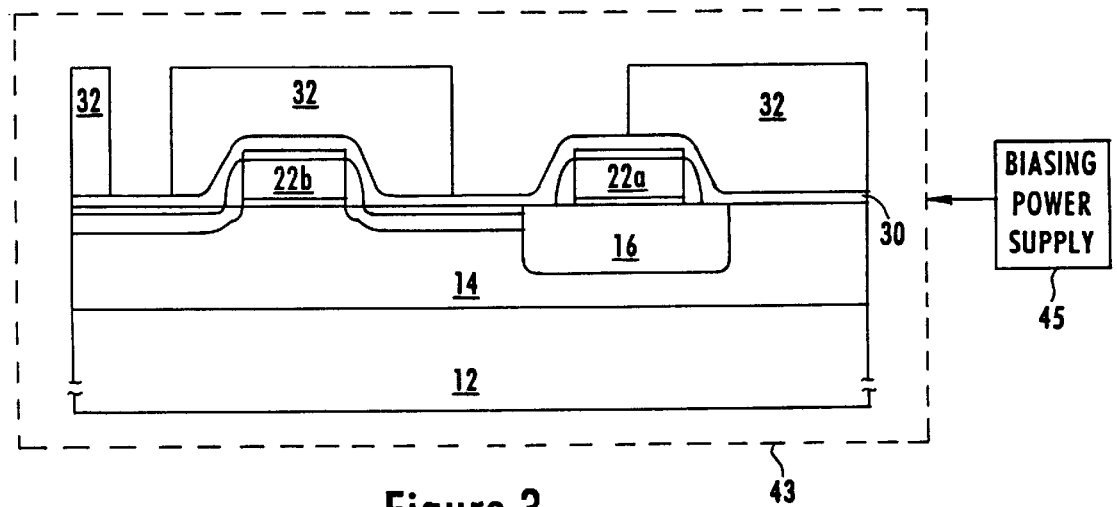
FIG. 3 depicts a cross-section of the portion of FIG. 2 following a second local interconnect etching process, in accordance with an embodiment of the present invention.

In accordance with the present invention, portion 10 in FIG. 3 is achieved without removing the semiconductor wafer from etching tool 43 by including an in-situ removal process that etches away resist mask 34 and polymer deposits 40 in the same etching tool as used in the previous dielectric etching process. This in-situ removal of the resist mask 34 and polymer deposits 40 eliminates the need to further handle the semiconductor wafer when moving it between two or more tools. The remaining portions of BARC layer 35 can also removed in-situ through a second BARC layer etching process if BARC layer 35 is an organic material. If BARC layer 35 is an inorganic material, then BARC layer 35 is removed in-situ along with the exposed portions of stop layer 30 as described below.

The in-situ etching processes of the present invention have the further benefit of keeping the internal chamber of the etching tool clean of polymers that are generated during the initial process. Thus, the in-situ etching processes provide a repeatable high-polymer deposit etching capability. As a result, the potential for contamination and/or other damage to the devices formed on the semiconductor wafer are reduced, the throughput of the fabrication process tends to increase and related manufacturing costs tend to be reduced.

The in-situ removal process will be described in greater detail below, following an overview of the remaining process steps in forming local interconnects within etched openings 38a and 38b.

Figure 4:
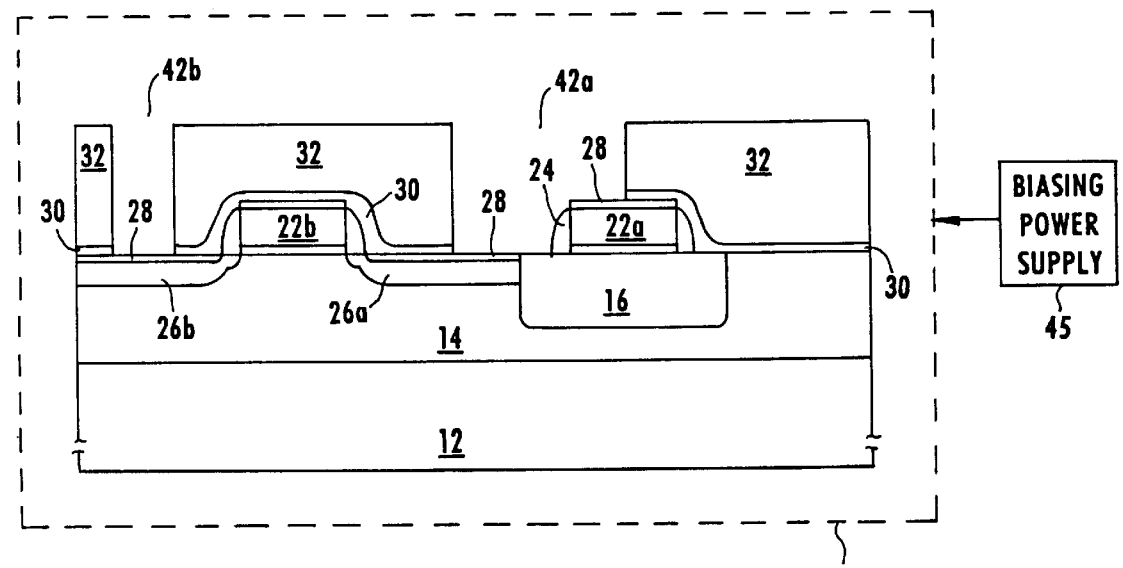
FIG. 4 depicts a cross-section of the portion of FIG. 3 following a third local interconnect etching process, in accordance with an embodiment of the present invention.

The next process step includes etching away exposed portions of stop layer 30 to reveal portions of suicide layer 28 over gate conductors 22a and 22b, and regions 26a and 26b. The resulting portion 10 is depicted in FIG. 4. As shown, once the exposed portions of stop layer 30 have been etched away, a local interconnect opening remains, such as local interconnect openings 42a and 42b, that provide access to selected active regions, and/or gate conductors, or other areas within portion 10 BARC layer 35, if inorganic material, is removed during this step as well.

In previous semiconductor processes, in order to etch the stop layer 30 the semiconductor wafer would be moved from the stripping tool that previously removed resist mask 34 and polymer deposits 40 to an etching tool that is configured to selectively etch the stop layer 30 by providing a high-selectivity to the materials in dielectric layer 32, spacers 24, titanium-silicide layer 28, and/or other exposed non-stop layer components.

In accordance with the present invention, portion 10 in FIG. 4 is achieved without having to move the semiconductor wafer back to an etching tool to remove the stop layer 30. Instead, with the in-situ etching process described above the semiconductor wafer was not removed from the etching tool, and therefore the in-situ etching process can continue in order to etch away the exposed portions of stop layer 30 by changing the etching recipe to remove the material in stop layer 30.

Thus, in certain embodiments of the present invention, the in-situ etching process is essentially a four-step process that in the first step etches through selected portions of BARC layer 35, in the second step etches through selected portions of dielectric layer 32, in the third step etches away resist mask 34, polymer deposits 40 and BARC layer 35 if made of an organic material, and in the fourth step etches away the remaining portions of BARC layer 35 if made of an inorganic material and/or etches away exposed portions of stop layer 30, all without removal of the semiconductor wafer from the etching tool 43.

The etching recipes, in accordance with the present invention, are preferably used to etch a semiconductor wafer as described above within a plasma etching tool, such as, for example a Centura System available from Applied Material of Santa Clara, Calif. However, those skilled in the art will recognize that the various parameters associated with the etching process and recipes are adjustable for differing arrangements, semiconductor wafers, layer stacks, layer materials, etching tools, and other common semiconductor manufacturing apparatus. As such, it is recognized that the present invention can be practiced with or without all of the parameters being adjusted or provided as described herein.

The first etching process, or the first of a four-step in-situ etching process, preferably includes anisotropically etching through BARC layer 35. If BARC layer 35 is an organic material, such as, for example CD-11, then the exposed portions of BARC layer 35 are etched using a mixture of $O_2$ and Argon (Ar) gas. The $O_2$ gas is preferably supplied at a rate between approximately 5 and 50 sccm, more preferably at a rate between approximately 10 and 30 sccm, and most preferably at a rate of approximately 20 sccm. The Ar gas is preferably supplied at a rate between approximately 0 and 200 sccm, more preferably at a rate between approximately 50 and 150 sccm, and most preferably at a rate of approximately 100 sccm. This first etching process tends to provide a high selectivity to oxide, which is the preferred material for dielectric layer 32, and as such the etching process is timed or otherwise controlled to end when dielectric layer 32 is reached. It is important to recognize that a portion of resist mask 34 will also be etched away during this first etching process. By making resist mask 34 significantly thicker than BARC layer 35, a sufficient amount of resist mask 34 will remain following the first etching process. For example, in one embodiment, BARC layer 35 is approximately 600 to 750Å thick, and resist mask 34 is approximately 10,000Å thick. In this embodiment, approximately 1000Å of resist mask 35 is removed during the first etching process, thereby leaving approximately 9000Å of resist mask 34.

Alternatively, if BARC layer 35 is an inorganic material, such as, for example SiON, then the exposed portions of BARC layer 35 are etched using $C_2F_6/O_2$ gas. The $C_2F_6$ gas is preferably supplied at a rate between approximately 10 and 50 sccm, more preferably at a rate between approximately 20 and 60 sccm, and most preferably at a rate of approximately 30 sccm. The $O_2$ gas is preferably supplied at a rate between approximately 5 and 30 sccm, more preferably at a rate of between approximately 10 and 20 sccm, and most preferably at a rate of approximately 15 sccm. In this embodiment the first etching process provides a high-selectivity to dielectric layer 32, and is preferably timed or otherwise controlled to end when dielectric layer 32 is reached.

The second etching process, or the second of a four step in-situ etching process, preferably includes anisotropically etching through selected portions of dielectric layer 32, which preferably includes TEOS oxide, using a mixture of a high polymer gas, such as, for example, $C_4F_8$, $CH_3F$ gas , and Argon (Ar) gas. The $C_4F_8$ gas is preferably supplied at a rate between approximately 5 and 20 sccm, more preferably at a rate between approximately 10 and 15 sccm, and most preferably at a rate of approximately 12 sccm. The $CH_3F$ gas is preferably supplied at a rate approximately 20 sccm or less, more preferably at a rate approximately 10 sccm or less, and most preferably at a rate of approximately 6 sccm. The Ar gas is preferably supplied at a rate approximately 200 sccm or less, more preferably at a rate between approximately 50 and 150 sccm, and most preferably at a rate of approximately 100 sccm. This second etching process provides a high selectivity to nitride, which is the preferred material for stop layer 30, and as such the etching process is timed or otherwise controlled to end when stop layer 30 is reached.

The third etching process, or the third step, preferably includes isotropically etching away resist mask 34 and polymer deposits 40 using a mixture of $O_2$ gas and Argon gas. Additionally, if BARC layer 35 is an organic material, then the remaining portions of BARC layer 35 are also etched away during this third etching process. The $O_2$ gas is preferably supplied at a rate between approximately 50 and 300 sccm, more preferably at a rate between approximately 150 and 250 sccm, and most preferably at a rate of approximately 200 sccm. The Ar gas, which may be required to stabilize the plasma, is preferably supplied at a rate approximately 100 sccm or less, more preferably at a rate approximately 50 sccm or less, and most preferably not required at all.

Additionally, a biasing power is supplied by biasing power supply 45 to the plasma etching chamber during an initial portion of the third etching process to further the etching of polymer deposits 40. The biasing power is preferably supplied at between approximately 100 Watts (W) and 400 W, more preferably between approximately 150 W and 300 W, and most preferably at approximately 200 W. It has been found that when the biasing power is too high damage can occur to the exposed portions of titanium-silicide layer 28.

In one embodiment, this third etching process further includes applying the biasing power for approximately the first 10–20 seconds of a 60–70 second timed process. This third etching process provides a high selectivity to the nitride in stop layer 30, and is timed or otherwise controlled to end when resist mask 34, polymer deposits 40 and BARC layer 35 (if organic) have been substantially removed.

The fourth etching process, or the fourth step, preferably includes anisotropically etching away stop layer 30, which is in one embodiment a layer of nitride or SiON, using a mixture of $CH_3F$ gas and $O_2$ gas. Additionally, if BARC layer 35 is an inorganic material then the remaining portions of BARC layer 35 are also etched away during the fourth etching process. The $CH_3F$ gas is preferably supplied at a rate between approximately 20 and 60 sccm, more preferably at a rate between approximately 30 and 50 sccm, and most preferably at a rate of approximately 40 sccm. The $O_2$ gas is preferably supplied at a rate between approximately 5 and 30 sccm, more preferably at a rate between approximately 5 and 15 sccm, and most preferably at a rate of approximately 10 sccm. This fourth etching process provides a high-selectivity to the oxide of dielectric layer 32 and spacers 24, and/or the silicide formed on gate conductors 22a and 22b and region 26a and 26b, for example. This fourth etching process is preferably timed or otherwise controlled to end when titanium-silicide layer 28 is reached.

Those skilled in the art will recognize that the etching processes described above are representative of a preferred mixture having associated ratios of gasses that are fully adaptable to other systems/arrangements based on the recipes of the present invention.

Figure 5:
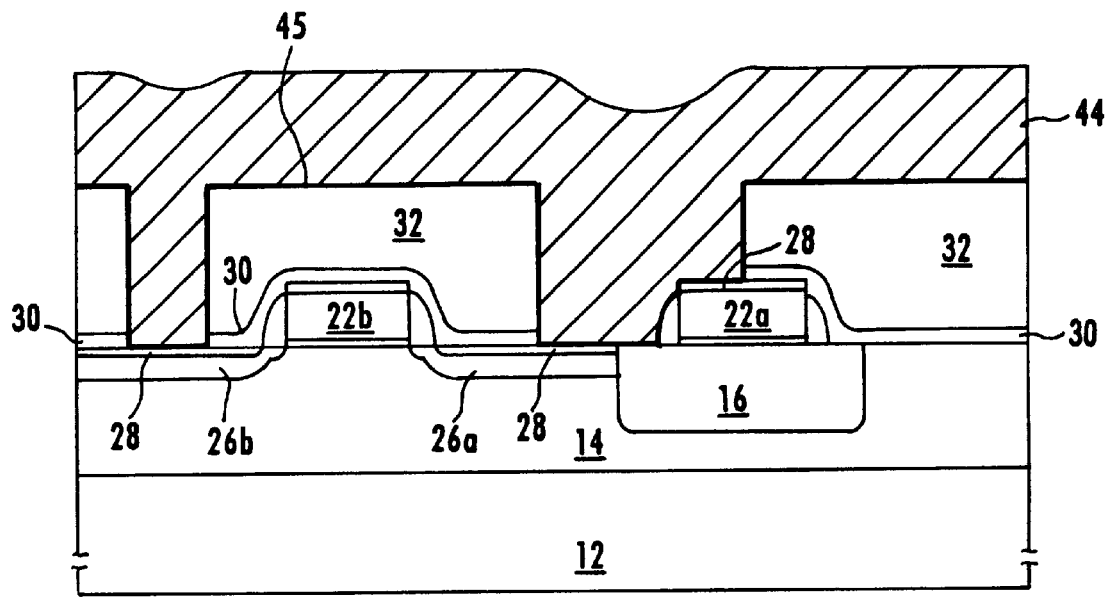
FIG. 5 depicts a cross-section of the portion of FIG. 4 following deposition of a conductive layer in the local interconnect openings of FIG. 4, in accordance with an embodiment of the present invention.
Figure 6:
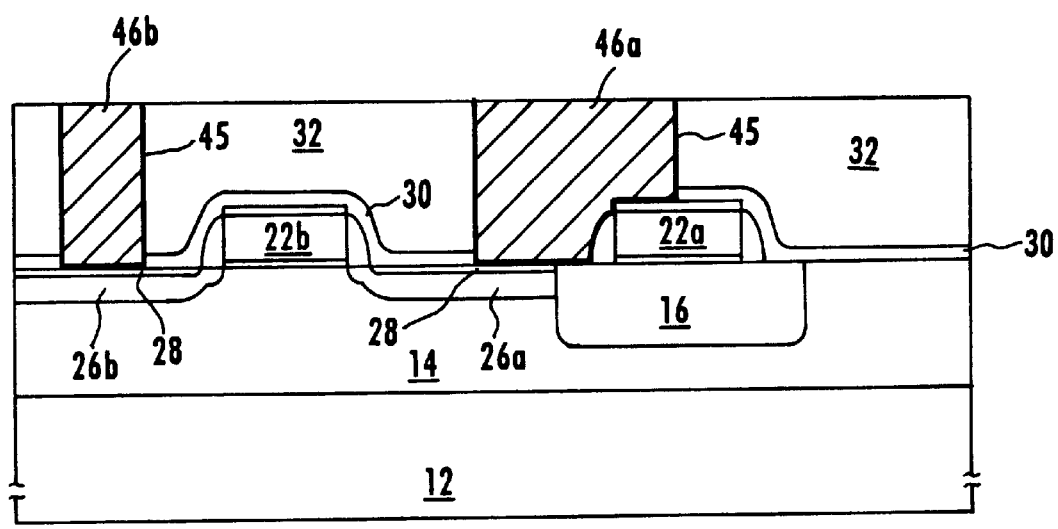
FIG. 6 depicts a cross-section of the portion of FIG. 5 following polishing of the conductive layer of FIG. 5, in accordance with an embodiment of the present invention.

Having formed local interconnect openings 42a and 42b, in accordance with the present invention, subsequent damascene process steps include filling openings 42a and 42b with a conductive layer 44 as depicted in FIG. 5, and planarizing the semiconductor wafer to leave local interconnects 46a and 46b as depicted in FIG. 6, for example. Conductive layer 44 serves to complete the local interconnects by providing a conductive medium between two or more active regions/contacts. For example, gate conductor 22a and silicide 28 thereon, are electrically coupled to the silicide formed on drain region 26a by local interconnect 46a. Conductive layer 44 is deposited in certain embodiments using conventional deposition techniques, such as, for example, a plasma-enhanced chemical vapor deposition (PECVD) process.

In certain preferred embodiments of the present invention, conductive layer 44 includes a thin film 45 of titanium and titanium nitride (Ti/TiN) which is sputtered over the semiconductor wafer and into local interconnect openings 42a and 42b, followed by a thick layer of tungsten. The thin film 45 of Ti/TiN provides for increased adhesion of the tungsten and lower contact resistance for the resulting local interconnects 46a and 46b. Following the deposition of conductive layer 44, the semiconductor wafer is planarized, such as, for example, using a polishing tool, which removes all of conductive layer 44, expect those portions which have been deposited within local interconnect openings 42a and 42b, thereby forming local interconnects 46a and 46b, respectively.

Thus, in accordance with the present invention, the in-situ removal process which etches away both the resist mask 34 and polymer deposits 40 in the same etching tool 43 eliminates the need to further handle the semiconductor wafer when moving it between two or more tools. As a result, the fabrication of local interconnects 46a and 46b, for example, is enhanced by reducing the potential for contamination due to excessive handling of the wafer, or incomplete/inadequate removal process steps, during the formation of the etched openings.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method for forming openings in a semiconductor wafer having a plurality of layers including a bottom anti-reflective layer, the method comprising:

using a single etching tool to etch through selected portions of a bottom anti-reflective layer, wherein the selected portions of the bottom anti-reflective layer are defined by etch windows formed by a mask layer above the bottom anti-reflective layer;

using the etching tool to etch through selected portions of a first underlying layer below the bottom anti-reflective layer, wherein the selected portions of the first underlying layer are defined by extended etch windows formed by the bottom anti-reflective layer above the first underlying layer;

using the etching tool to substantially etch away the mask layer using $O_2$ gas;

using the etching tool to etch through selected portions of a second underlying layer that is below the first underlying layer using a mixture of $CH_3F$ gas and $O_2$ gas, wherein the selected portions of the second underlying layer are defined by etched openings in the first underlying layer corresponding to the extended etch windows.

2. The method as recited in claim 1, wherein the bottom anti-reflective layer includes organic material, and is substantially etched away in the etching tool using $O_2$ gas.

3. The method as recited in claim 1, wherein the bottom anti-reflective layer includes inorganic material and is substantially etched away in the etching tool using $CH_3F$ gas and $O_2$ gas.

4. The method as recited in claim 1, wherein the first underlying layer is a dielectric layer.

5. The method as recited in claim 1, wherein the first underlying layer is an oxide layer.

6. The method as recited in claim 1, wherein the mask layer is a resist layer.

7. The method as recited in claim 1, wherein the selected portions of a first underlying layer below the bottom anti-reflective layer are etched using a mixture of $C_4F_8$ gas and $CH_3F$ gas.

8. The method as recited in claim 1, wherein the mask layer is etched using $O_2$ gas.

9. The method as recited in claim 1, wherein the first underlying layer is etched using a mixture of $CH_3F$ gas and $O_2$ gas.

10. The method as recited in claim 1, further comprising supplying argon (Ar) gas to the etching tool when etching at least one of the first underlying and mask layers.

11. The method as recited in claim 1, wherein the bottom anti-reflective layer is an organic material, and the selected portions of the bottom anti-reflective layer are etched using $O_2$ gas.

12. The method as recited in claim 1, wherein the bottom anti-reflective layer is an inorganic material, and the selected portions of the bottom anti-reflective layer are etched using $C_2F_6$ gas.

13. The method as recited in claim 1, wherein the etching tool is a plasma etching tool configured to anisotropically etch one or more semiconductor wafers.

14. The method as recited in claim 13, wherein the etching tool includes a biasing power supply configured to supply a biasing power to a plasma chamber.

15. The method as recited in claim 14, wherein when etching away the mask layer further includes selectively supplying approximately 100 to 400 Watts of the biasing power to the plasma chamber.

16. The method as recited in claim 1, wherein the etching through of the first underlying layer includes using approximately 5 to 20 sccm of $C_4F_8$ gas.

17. The method as recited in claim 10, wherein the etching through of the first underlying layer includes using approximately 200 sccm or less of Argon gas.

18. The method as recited in claim 1, wherein the etching away the mask layer includes using approximately 5 to 300 sccm of $O_2$ gas.

19. The method as recited in claim 10, wherein the etching away the mask layer includes using approximately 100 sccm or less of Argon gas.

20. The method as recited in claim 1, wherein the etching through of the second underlying layer includes using approximately 20 to 60 sccm of $CH_3F$ gas.

21. The method as recited in claim 1, wherein the etching through of the second underlying layer includes using approximately 20 sccm or less of $O_2$ gas.

22. The method as recited in claim 1, wherein the second underlying layer is a stop layer.

23. The method as recited in claim 1, wherein the second underlying layer is a nitride layer.

24. The method as recited in claim 1 further comprising depositing a conductive material within a local interconnect opening that extends through the first and second underlying layers.

25. The method as recited in claim 24 wherein the conductive material includes at least one material selected from the set consisting of tungsten (W), and titanium (Ti)/titanium-nitride (TiN).

* * * * *